(12) United States Patent
Kuniya

(10) Patent No.: US 8,729,667 B2
(45) Date of Patent: May 20, 2014

(54) NON-VOLATILE MEMORY DEVICE AND METHOD OF MANUFACTURING THE SAME

(75) Inventor: Takuji Kuniya, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 13/609,679

(22) Filed: Sep. 11, 2012

(65) Prior Publication Data

US 2013/0187112 A1    Jul. 25, 2013

(30) Foreign Application Priority Data

Jan. 23, 2012    (JP) .................................. 2012-011354

(51) Int. Cl.
  *H01L 29/06*    (2006.01)
(52) U.S. Cl.
  USPC .......................................... 257/536; 257/653
(58) Field of Classification Search
  CPC ............ H01L 27/2409; H01L 27/2481; H01L 45/1233
  USPC ................................................ 257/536, 653
  See application file for complete search history.

(56) References Cited

U.S. PATENT DOCUMENTS

| 8,153,488 | B2 | 4/2012 | Nishitani et al. | |
| 8,178,875 | B2 * | 5/2012 | Kiyotoshi | 257/41 |
| 8,468,692 | B2 * | 6/2013 | Kim | 29/846 |
| 2010/0078758 | A1 * | 4/2010 | Sekar et al. | 257/530 |
| 2010/0203738 | A1 | 8/2010 | Sasaki | |
| 2010/0243980 | A1 | 9/2010 | Fukumizu | |
| 2011/0147942 | A1 | 6/2011 | Yahashi et al. | |
| 2012/0052651 | A1 * | 3/2012 | Lowrey | 438/381 |
| 2012/0069625 | A1 * | 3/2012 | Wada | 365/148 |
| 2012/0135580 | A1 * | 5/2012 | Scheuerlein et al. | 438/381 |
| 2013/0181181 | A1 * | 7/2013 | Sekar et al. | 257/2 |
| 2013/0320292 | A1 * | 12/2013 | Nakajima | 257/5 |

FOREIGN PATENT DOCUMENTS

| JP | 2010-183038 | 8/2010 |
| JP | 2010-226027 | 10/2010 |
| JP | 2010-232214 | 10/2010 |
| JP | 2011-71302 | 4/2011 |
| JP | 4756080 | 6/2011 |

* cited by examiner

*Primary Examiner* — Ngan Ngo

(74) *Attorney, Agent, or Firm* — Oblon, Spivak, McClelland, Maier & Neustadt, L.L.P.

(57) ABSTRACT

According to one embodiment, a second electrode layer is formed on first structures where a first electrode layer and a first memory cell layer sequentially stacked above a substrate are patterned in a line-and-space shape extending in a first direction and a first interlayer insulating film embedded between the first structures. Etching is performed from the second electrode layer to a predetermined position in an inner portion of the first memory cell layer by using a first mask layer having a line-and-space pattern extending in a second direction, so that a first trench is formed. A first modifying film is formed on a side surface of the first trench, anisotropic etching is performed on the first memory cell layer by using the first mask layer, and after that, isotropic etching is performed.

5 Claims, 22 Drawing Sheets

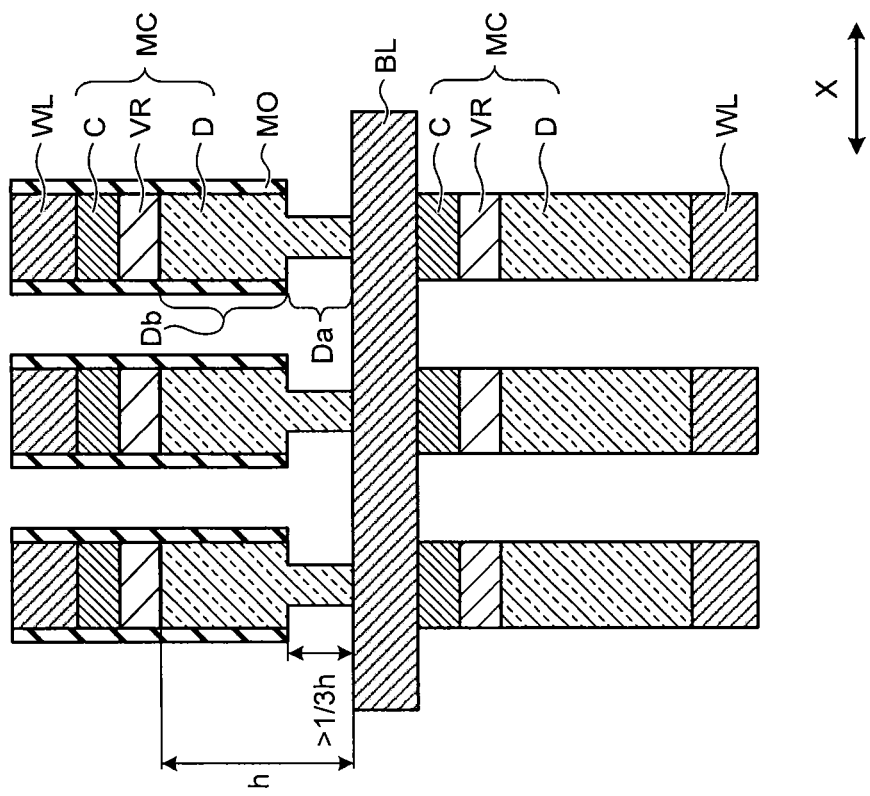
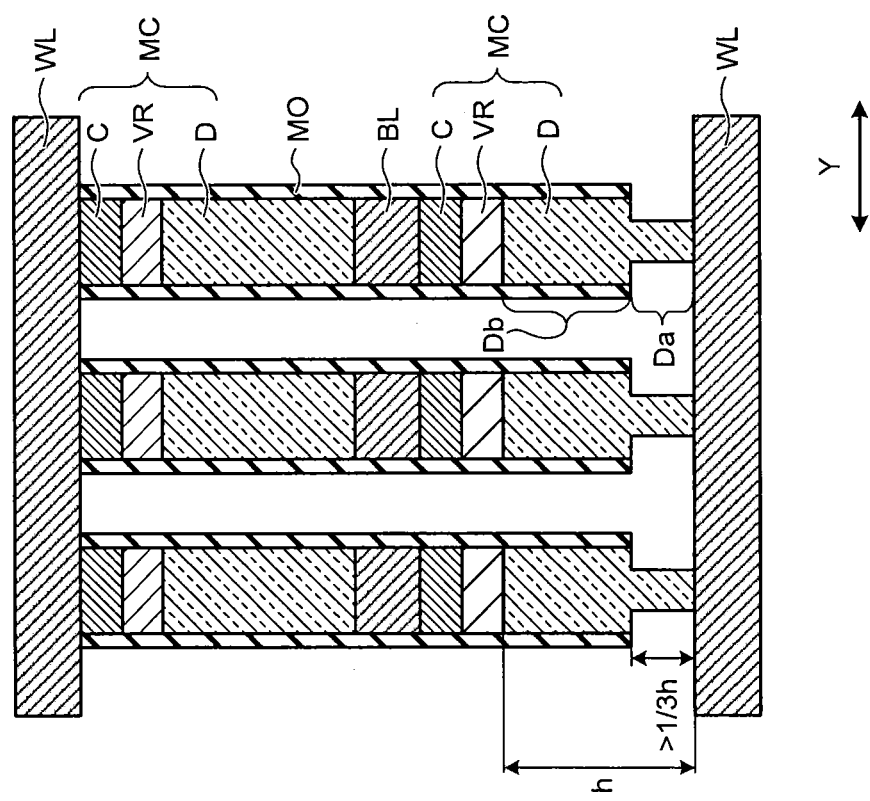

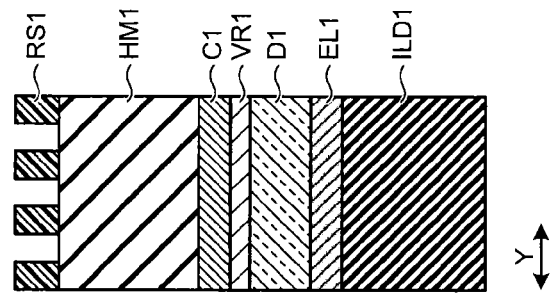
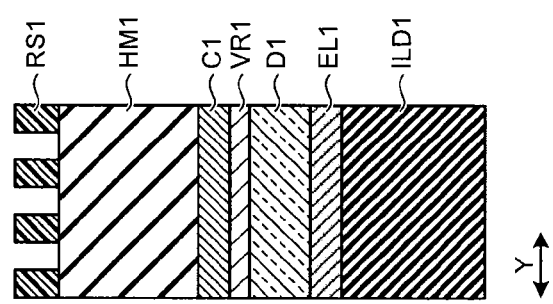
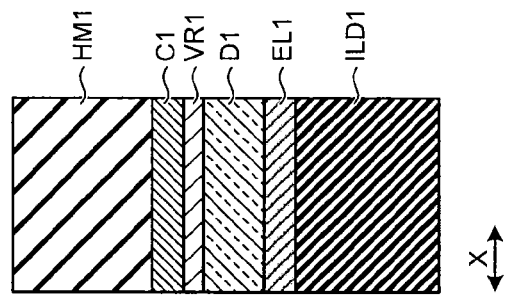
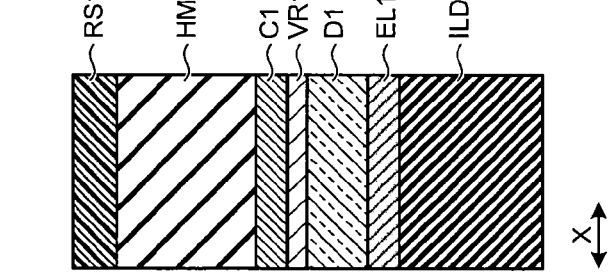
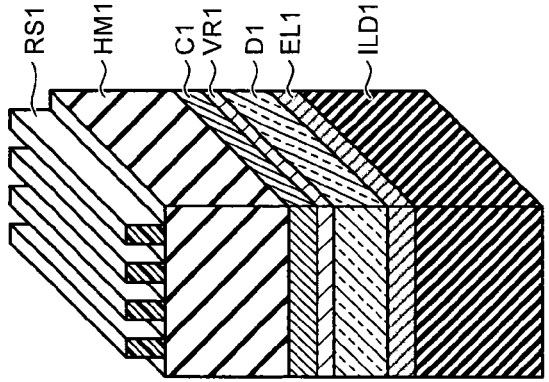

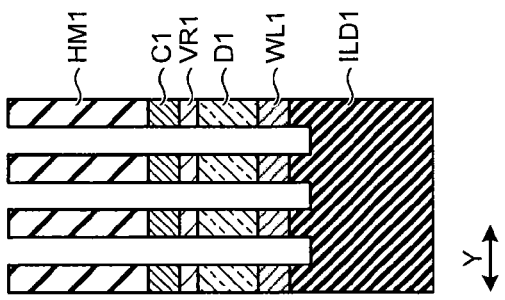
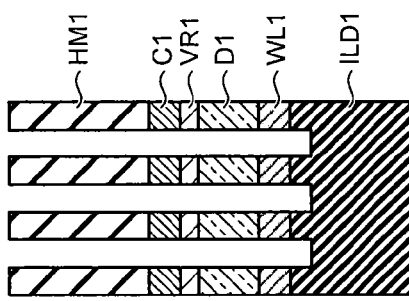
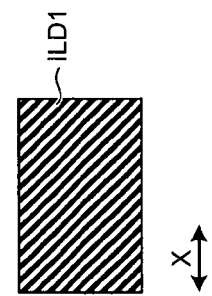
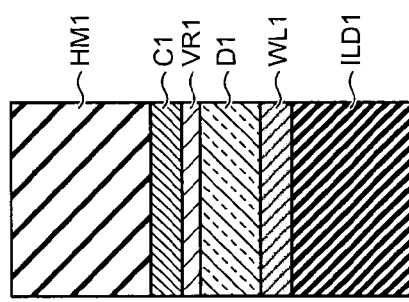
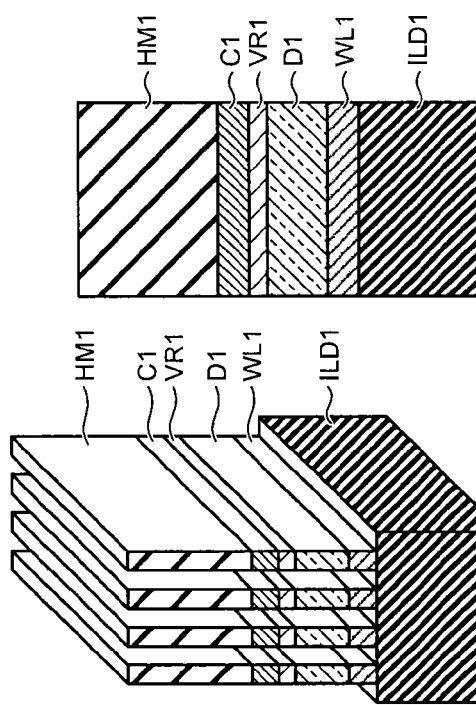

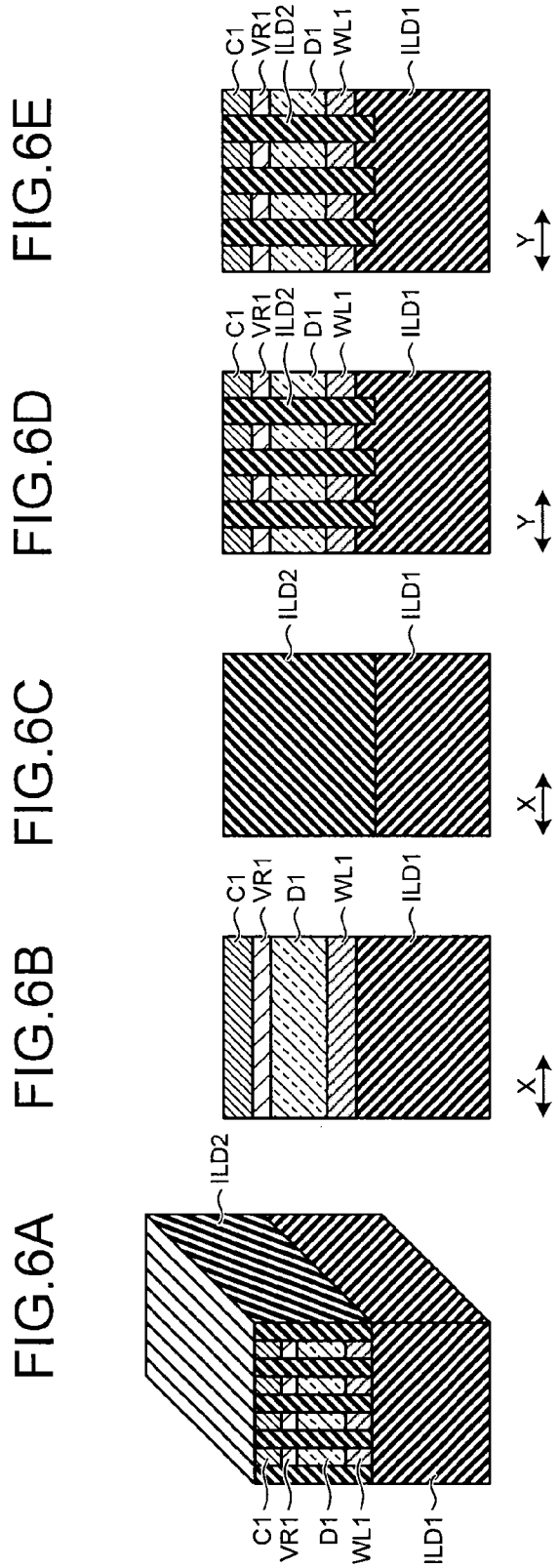

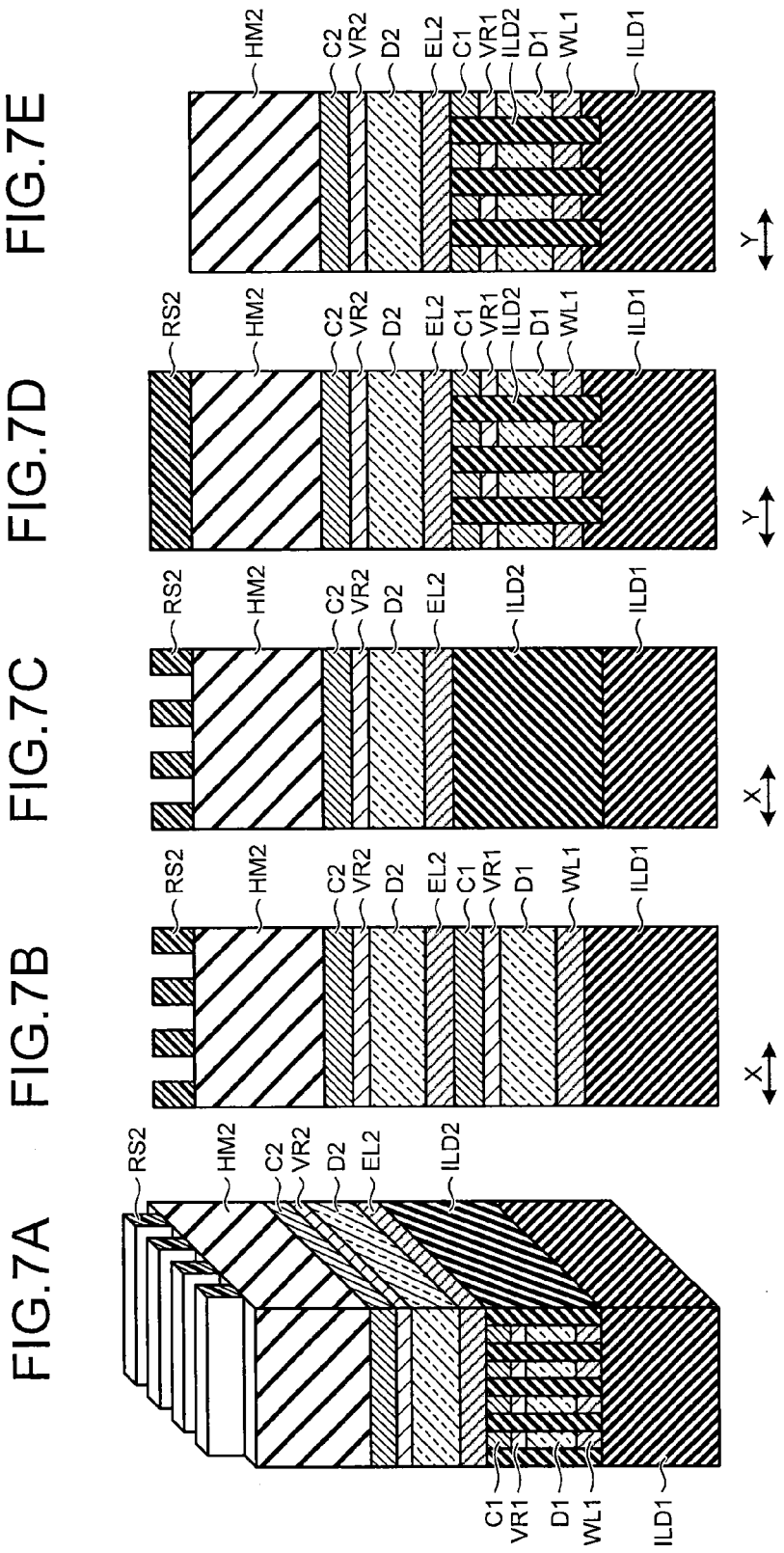

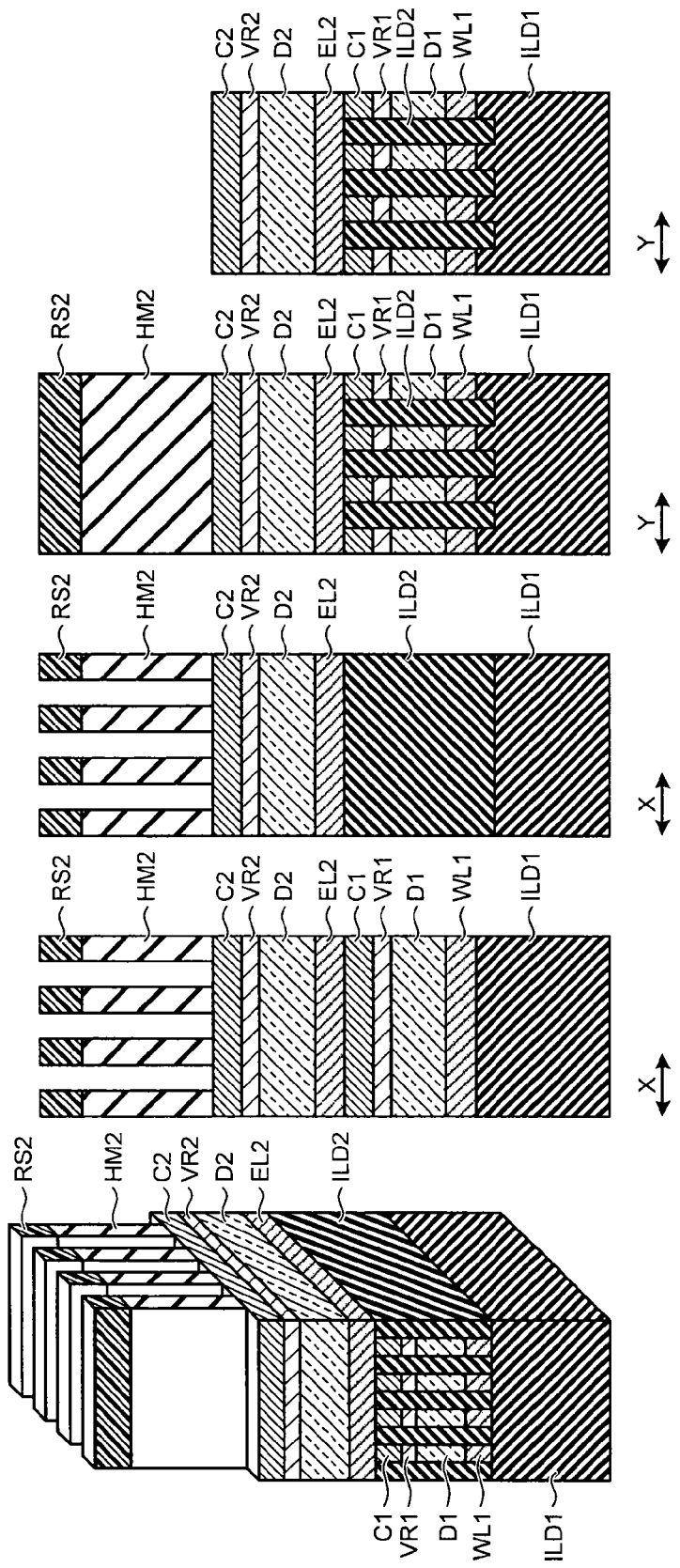

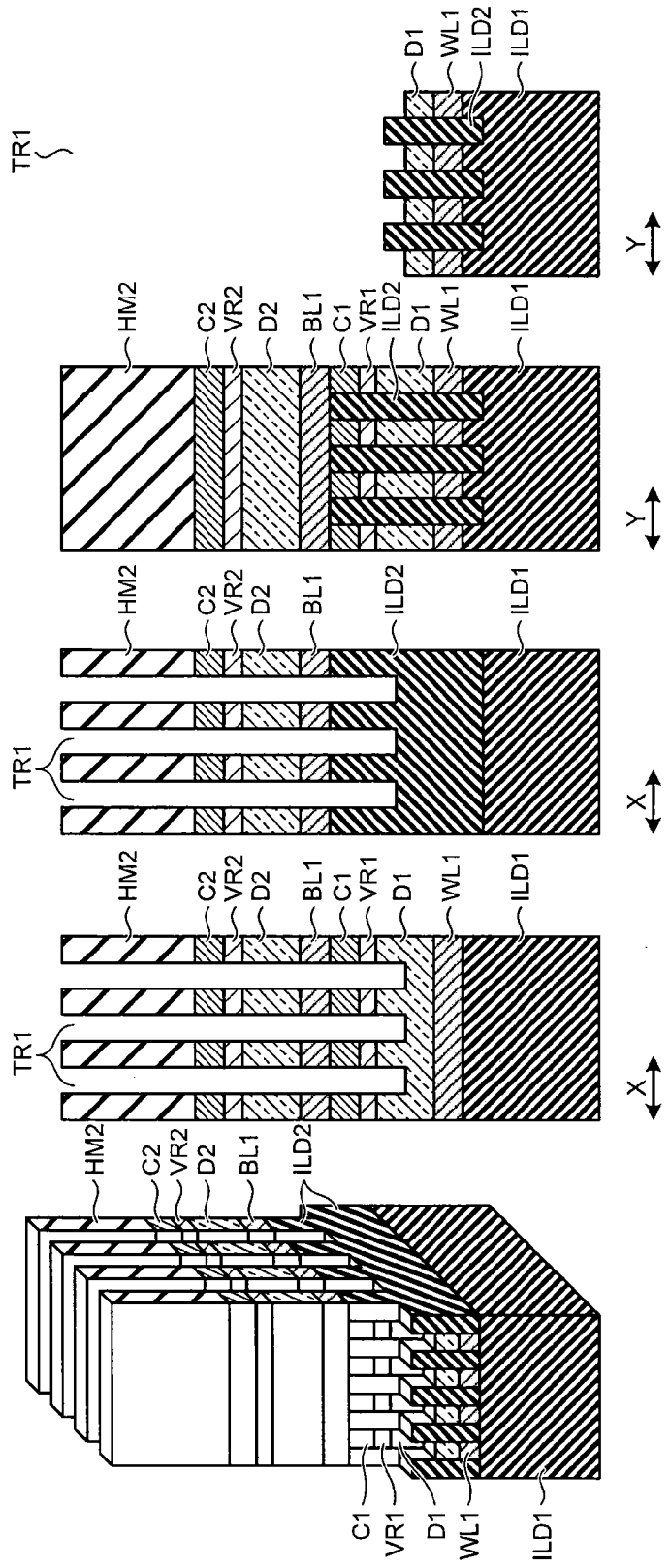

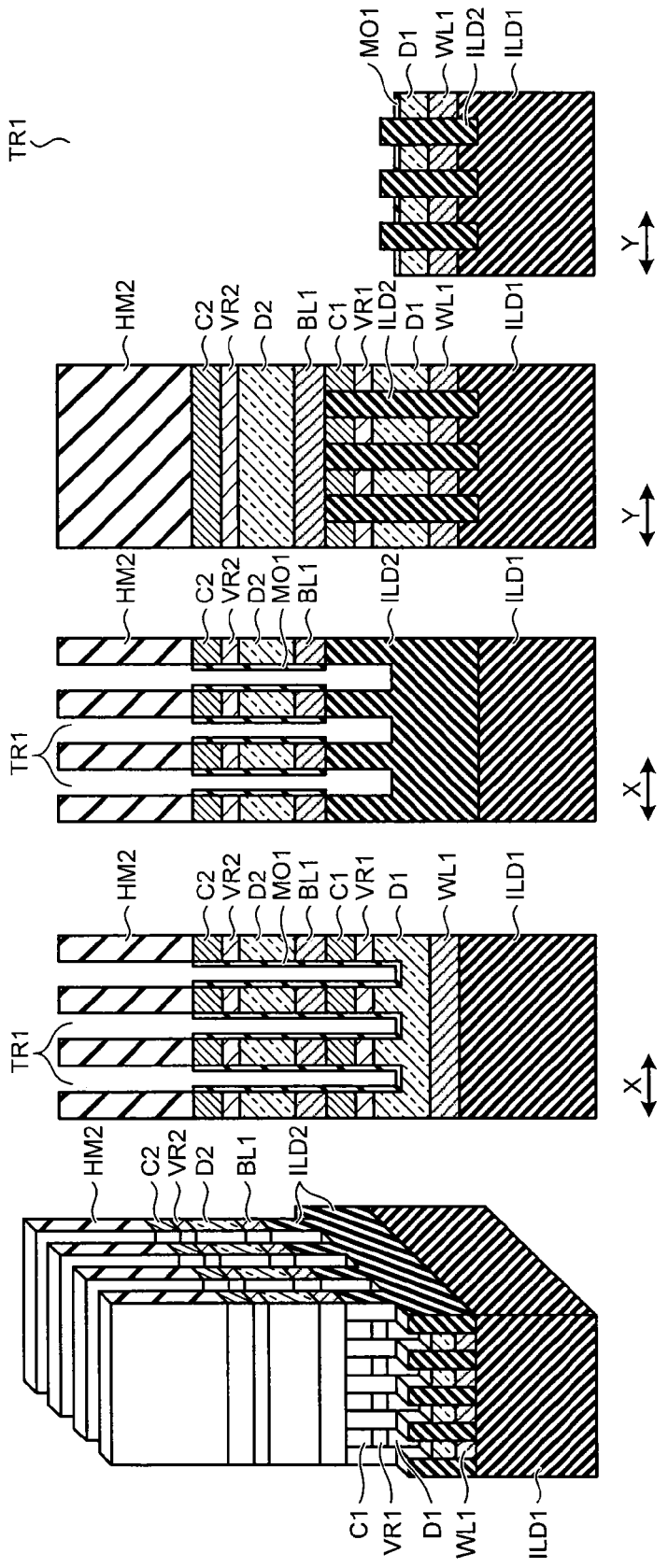

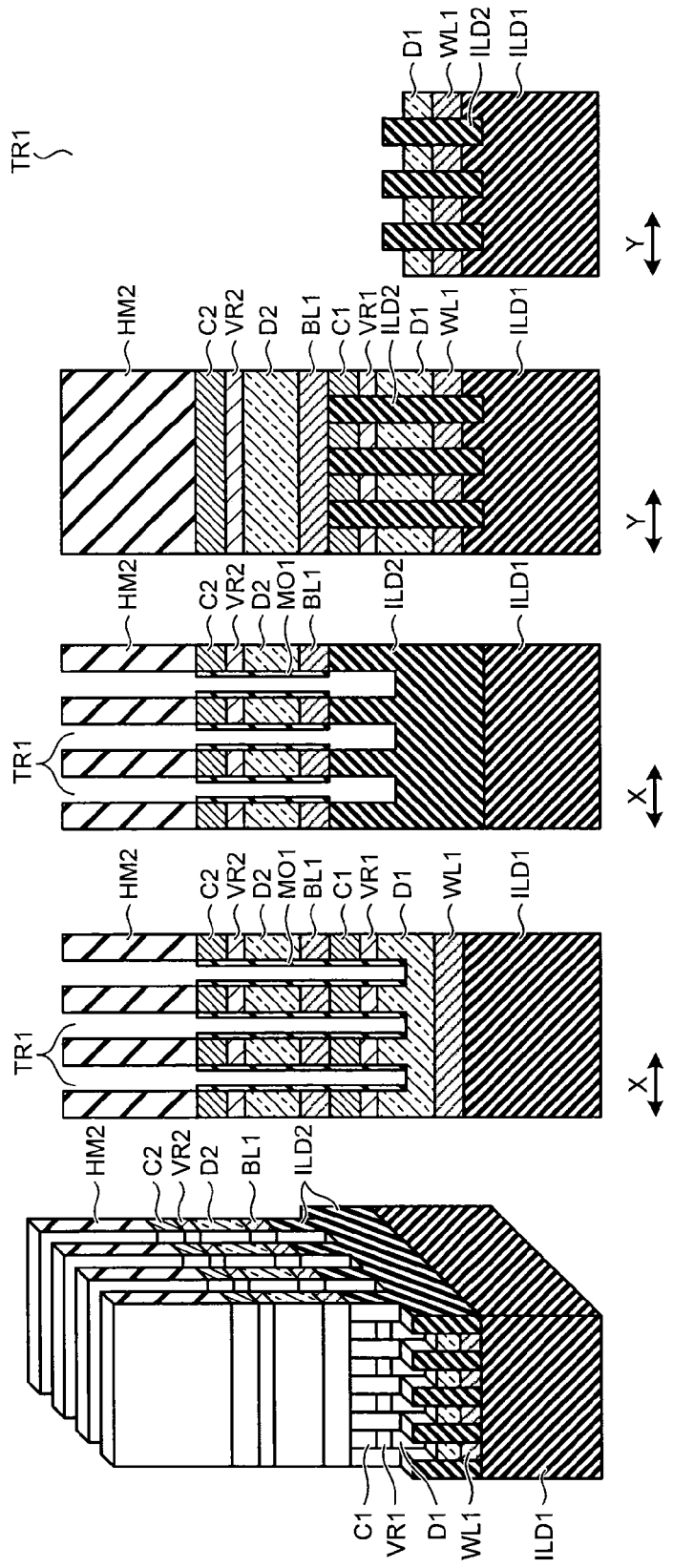

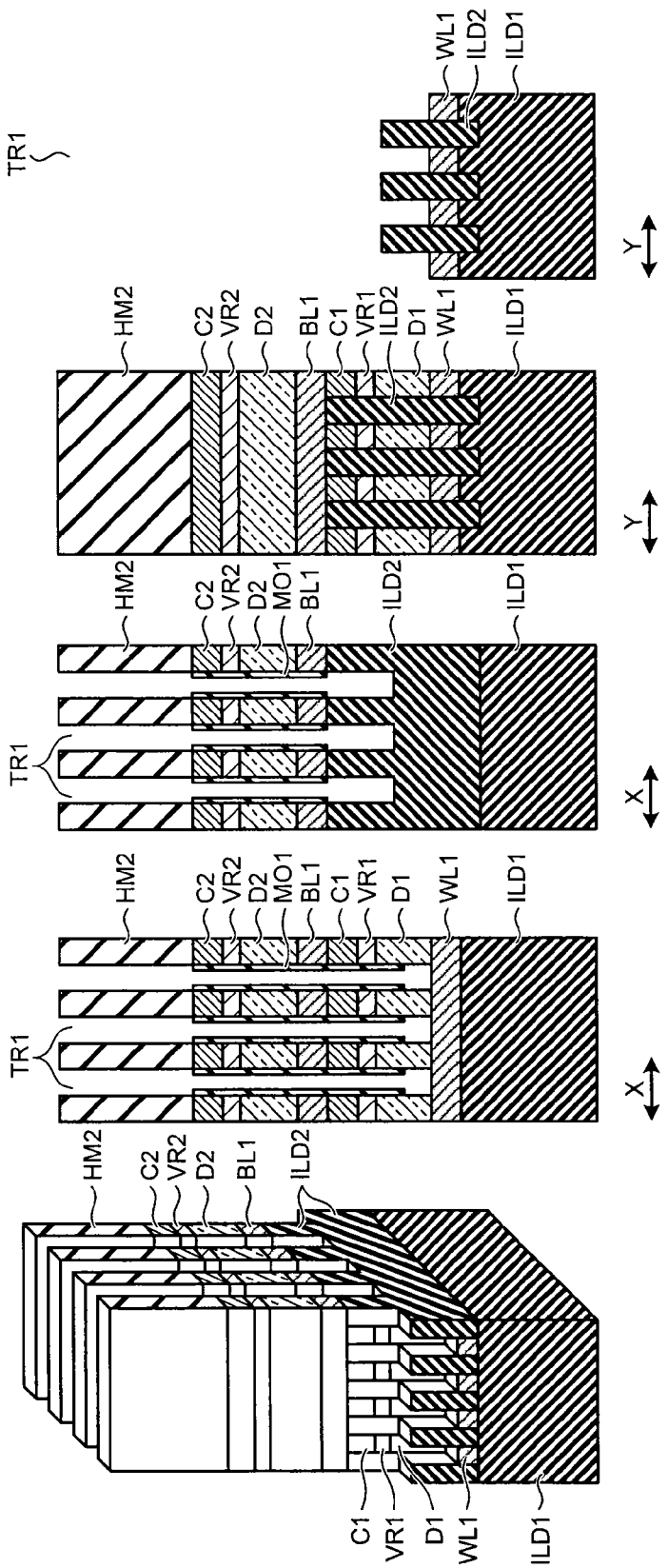

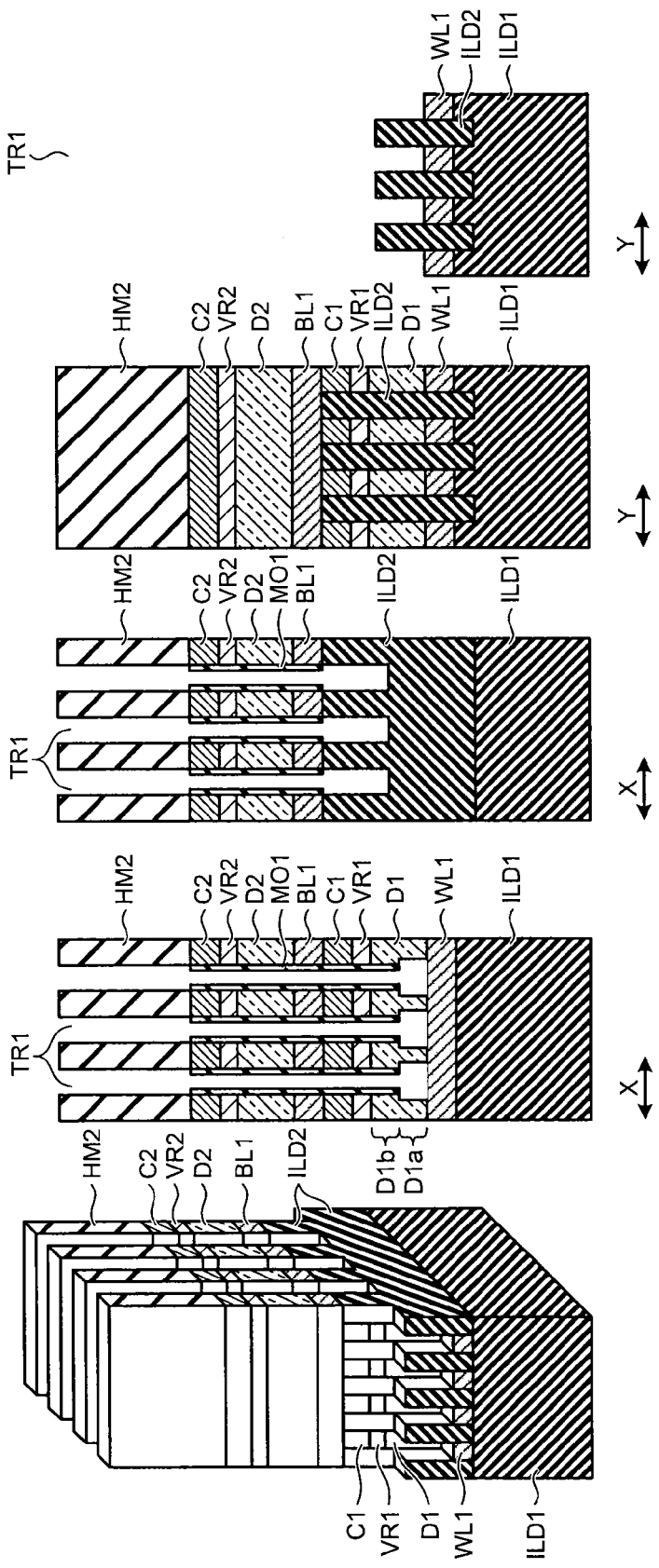

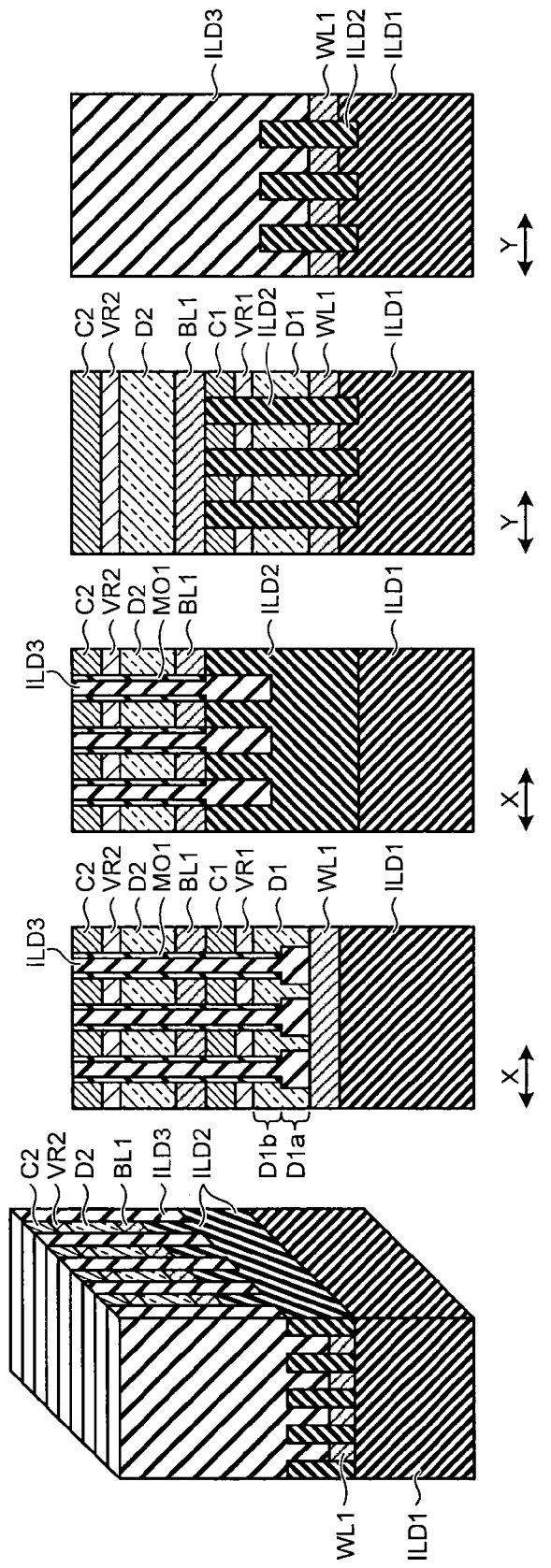

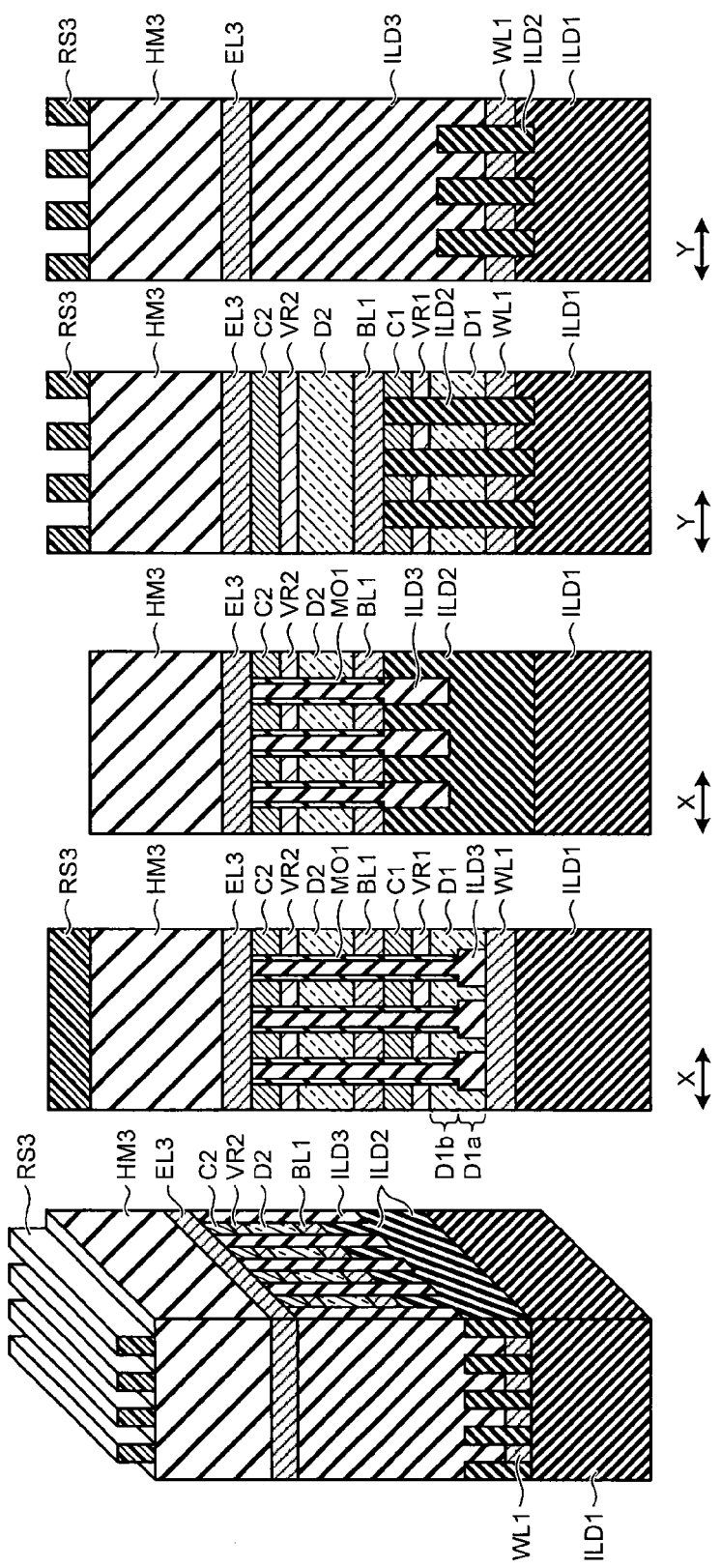

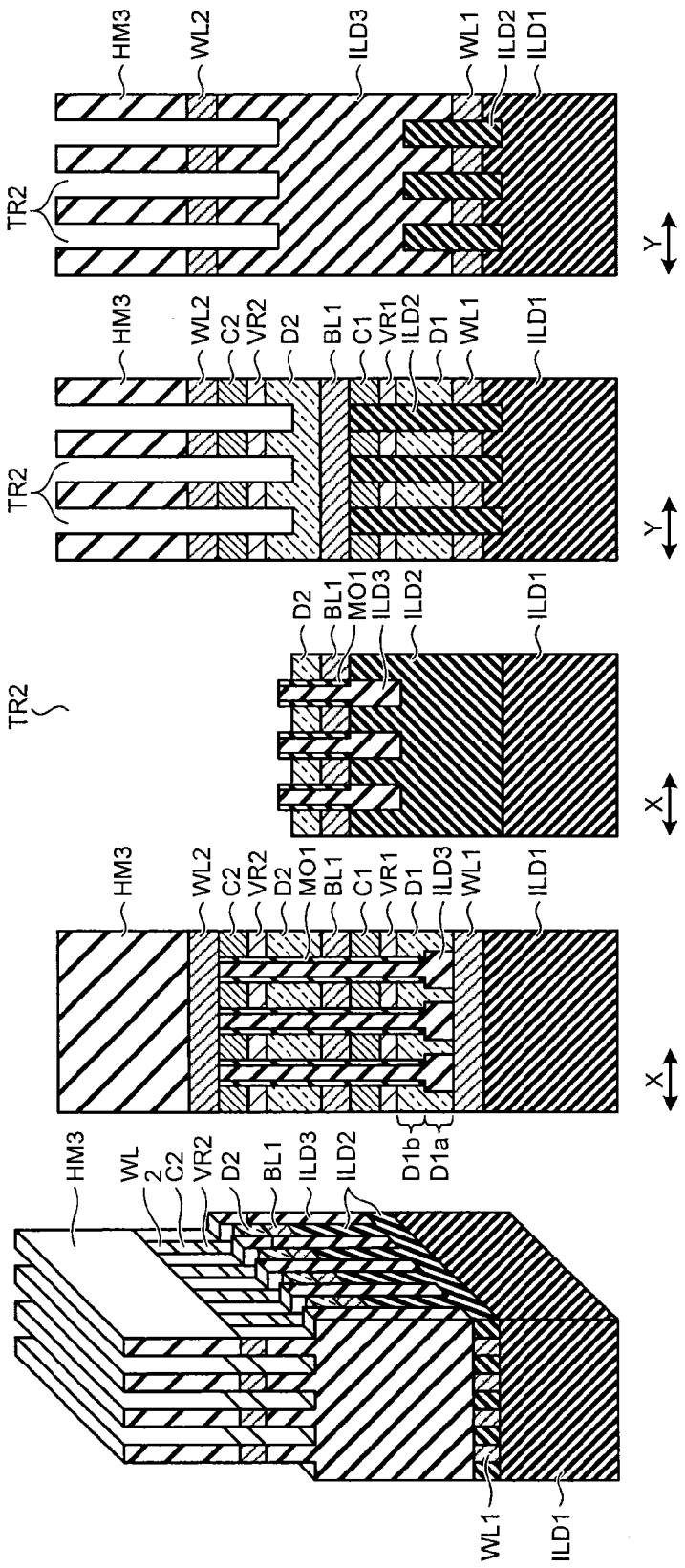

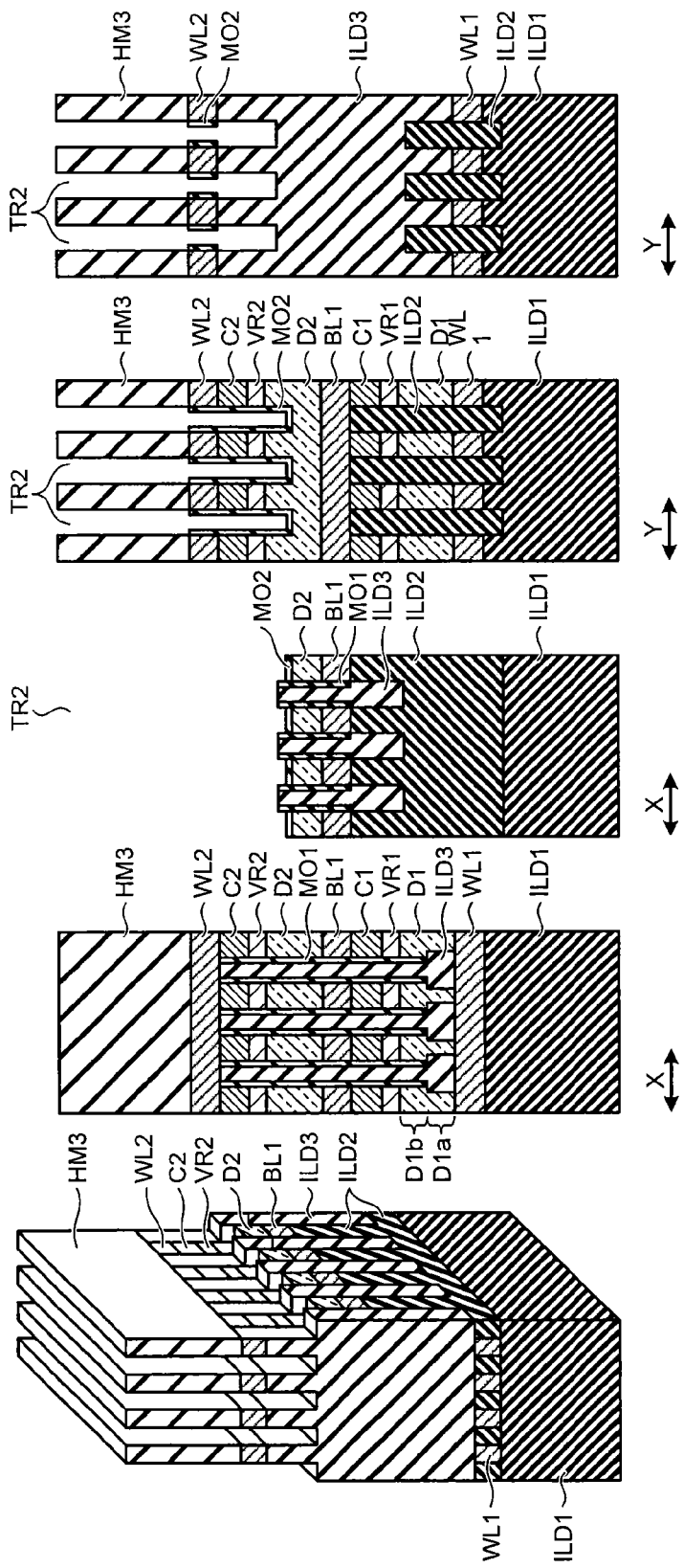

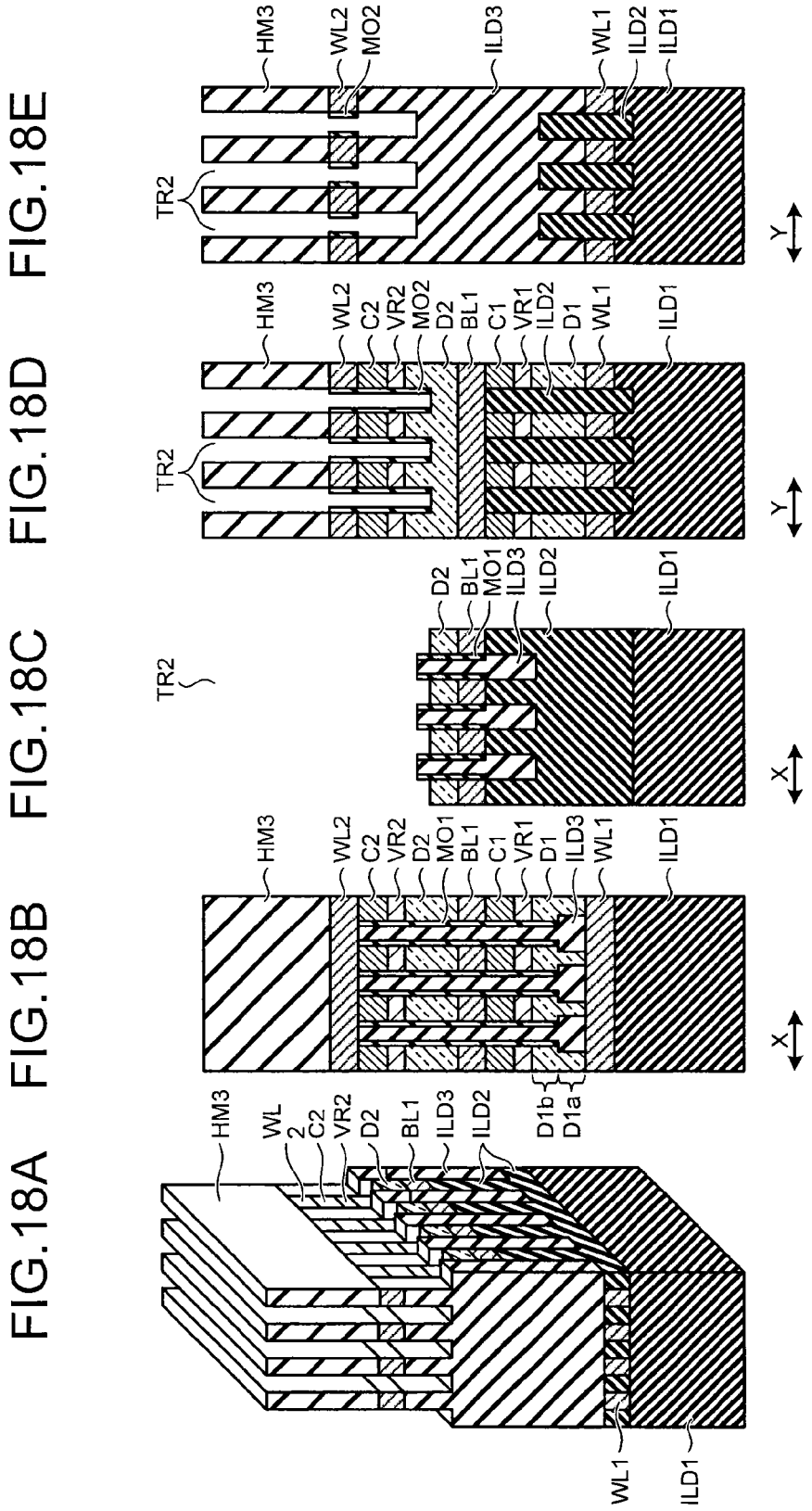

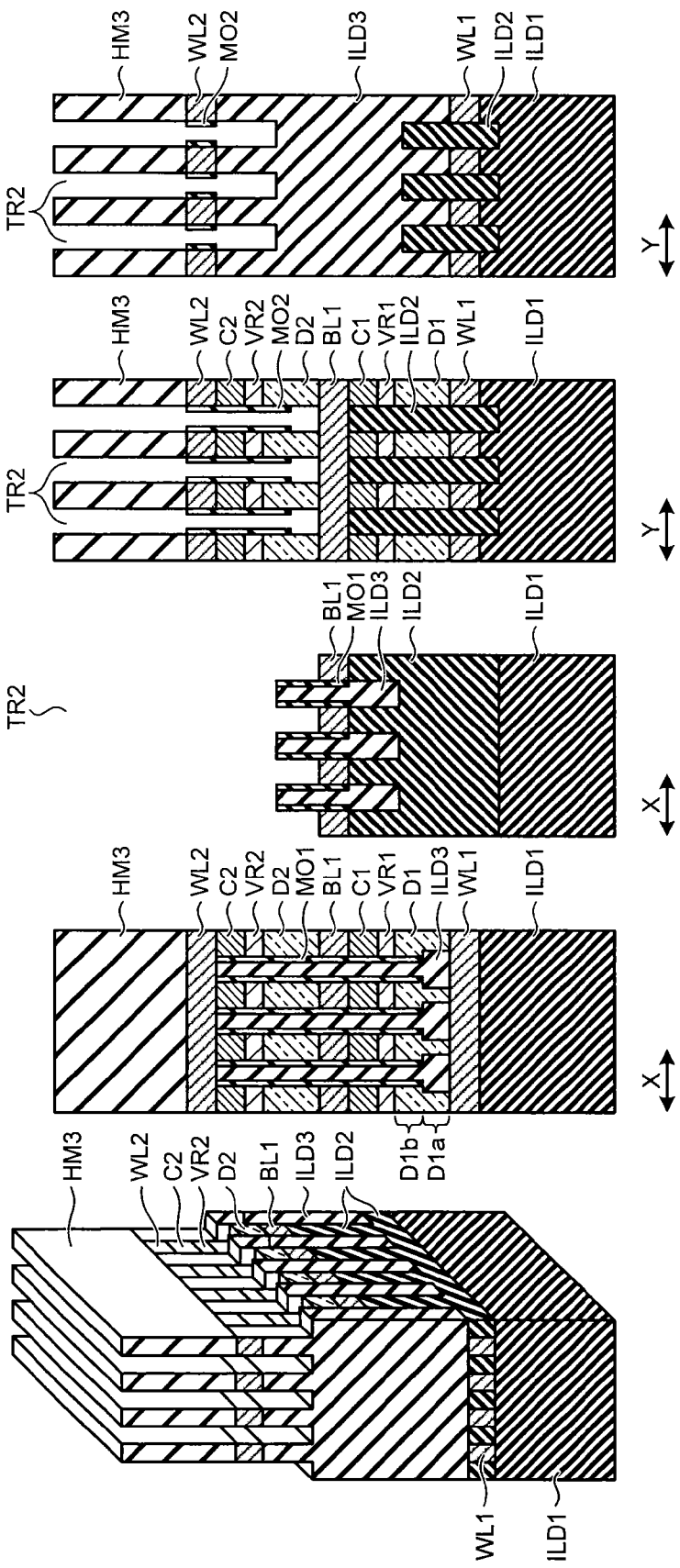

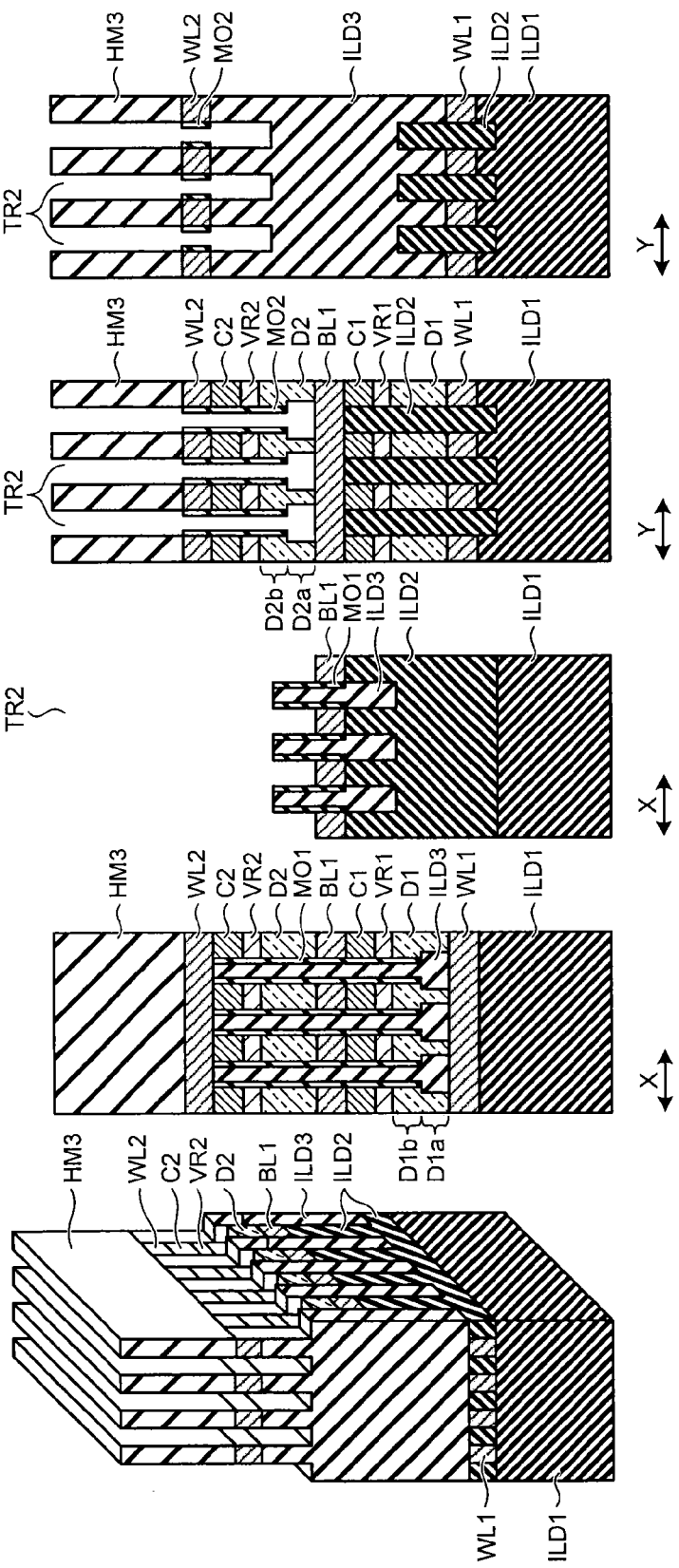

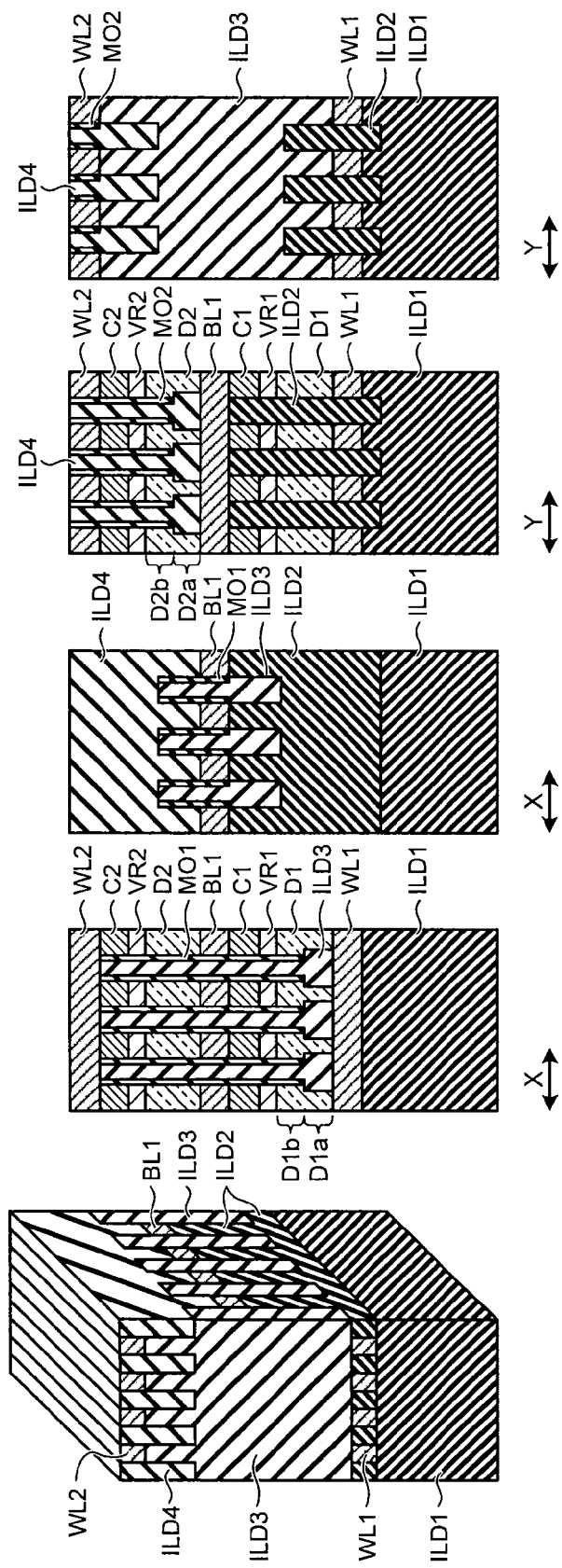

NON-VOLATILE MEMORY DEVICE AND METHOD OF MANUFACTURING THE SAME

CROSS-REFERENCE TO RELATED APPLICATIONS

This application is based upon and claims the benefit of priority from Japanese Patent Application No. 2012-011354, filed on Jan. 23, 2012; the entire contents of which are incorporated herein by reference.

FIELD

Embodiments described herein relate generally to a non-volatile memory device and a method of manufacturing the same.

BACKGROUND

Recently, a resistive random access memory (ReRAM) of storing resistance value information, that is, a high resistance state and a low resistance state, of an electrically-rewritable variable resistive element in a non-volatile manner has attracted attention as a non-volatile memory device. In a well-known structure of such an ReRAM, for example, a plurality of memory cell arrays formed by arranging variable resistance memory cells where variable resistive elements as memory elements and rectifying elements such as diodes are connected in series in an array shape at intersections of a plurality of word lines extending parallel to a first direction and a plurality of bit lines extending parallel to a second direction perpendicular to the first direction are stacked, and the word lines or the bit lines are shared by the memory cell arrays adjacent to each other in the stack direction.

Such a non-volatile memory device is manufactured as follows. A first wiring material layer which is to be a word line and a first memory cell layer including a variable resistive layer which is to be a variable resistive element and a diode layer which is to be a rectifying element are stacked on an interlayer insulating film. Next, the first wiring material layer and the first memory cell layer are etched through a lithography technique and a reactive ion etching technique (hereinafter, referred to as an RIE method) to form a line-and-space pattern extending in the first direction, and the interlayer insulating film is embedded between the patterns. Accordingly, the first wiring material layer becomes the word line. Next, a second wiring material layer which is to be a bit line and a second memory cell layer including a variable resistive layer and a diode layer are stacked on the interlayer insulating film. Next, the second memory cell layer, the second wiring material layer, the first memory cell layer, and the interlayer insulating film are etched through the lithography technique and the RIE method to form a line-and-space pattern extending in the second direction, and the interlayer insulating film is embedded between the patterns. Accordingly, the second wiring material layer becomes the bit line, so that a first-layer memory cell array where memory cells having a columnar structure are arrayed in a matrix shape at the cross-points of the word lines and the bit lines is formed. Next, the same process is repeated, so that a multi-layer memory cell array is formed.

In the related art, when memory cell components of the two layers are processed at one time, in a portion which is in contact with the interlayer insulating film embedded between the memory cell layers of the lower layer side, the interlayer insulating film becomes an eave-shaped portion, so that residues of the memory cell components easily remain. Therefore, in the case where such residues are not removed, there is a problem in that short-circuit occurs in the lower-layer memory cell array due to the residues of the memory cell components in the lower portion between the adjacent memory cells.

BRIEF DESCRIPTION OF THE DRAWINGS

FIGS. 2A and 2B are schematic cross-sectional views illustrating a configuration of a variable resistance memory cell as a non-volatile memory device;

FIGS. 3A to 21E are schematic cross-sectional views illustrating an example of a procedure of a method of manufacturing a non-volatile memory device according to a first embodiment.

DETAILED DESCRIPTION

According to an embodiment, there is provided a method of manufacturing a non-volatile memory device where a plurality of non-volatile memory cells which are disposed at intersection positions of a plurality of first wirings extending in a first direction and a plurality of second wirings extending in a second direction perpendicular to the first direction so as to be interposed between the first and second wirings are stacked in a height direction. First, on structures where a first electrode layer which is to be the first wirings and a first memory cell layer configuring the non-volatile memory cells are sequentially stacked above a substrate and are patterned in a line-and-space shape extending in the first direction, and on an interlayer insulating film which is embedded between the structures, a second electrode layer which is to be the second wirings is formed. Next, etching is performed on layers from the second electrode layer to a predetermined position in an inner portion of the first memory cell layer by using a mask layer having a line-and-space pattern extending in the second direction as a mask, so that a trench is formed in a line-and-space shape extending in the second direction. Next, a modifying film is formed on a side surface of the trench, and anisotropic etching is performed on the remaining first memory cell layer in the portion lower than the trench, where the modifying film is formed on the side surface thereof, by using the mask layer as a mask. After the anisotropic etching, isotropic etching is performed on the first memory cell layer.

Hereinafter, a non-volatile memory device and a method of manufacturing a non-volatile memory device according to the embodiment will be described in detail with reference to the attached drawings. The invention is not limited to the embodiment. In addition, cross-sectional views of the non-volatile memory device used in the embodiment described hereinafter are schematic views, and thus, the relation between thickness and width of a layer, magnification ratio of thickness of layers, and the like may be different from actual ones. In addition, in the description, a variable resistance memory is exemplified as a non-volatile memory device.

Figure 1:
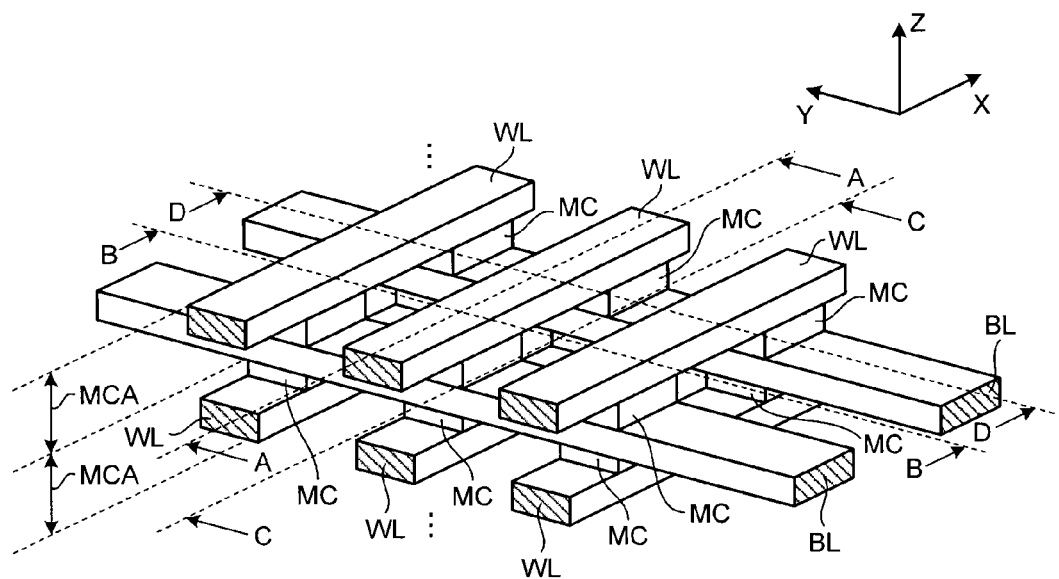
FIG. 1 is a schematic perspective view illustrating a structure of a non-volatile memory device.
Figure 4E:
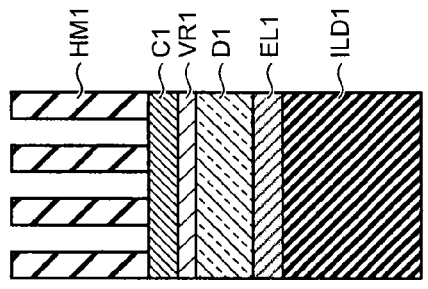
Figure 4D:
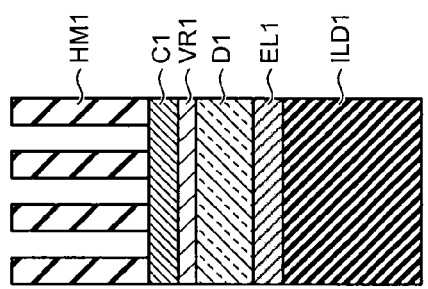
Figure 4C:
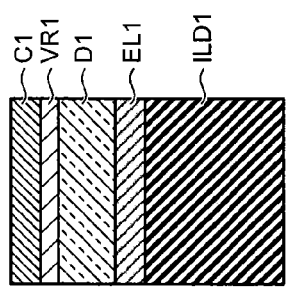
Figure 4B:
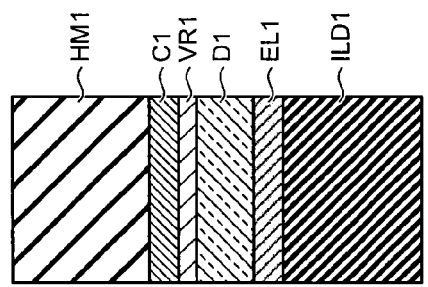
Figure 4A:
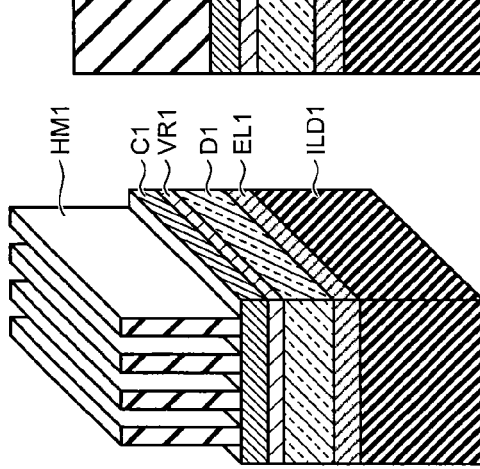

FIG. 1 is a schematic perspective view illustrating a structure of a non-volatile memory device. In addition, in the figures hereinafter, the extending direction of a word line WL is set as the X direction, the extending direction of a bit line BL is set as the Y direction; and the direction perpendicular to both of the X and Y directions is set as the Z direction. The non-volatile memory device includes a memory cell array MCA where a plurality of word lines WL extending in the X direction and a plurality of bit lines BL extending in the Y direction at a height different from that of the word lines WL are arrayed so as to intersect each other, and non-volatile memory cells (hereinafter, simply referred to as memory cells) MC such as variable resistance memory cells are arranged at the intersection positions. In the case of FIG. 1 where two layers of the memory cell arrays MCA are stacked in the Z direction (height direction), the bit lines BL are shared between the memory cells MC adjacent to each other in the Z direction. In addition, in the case where three or more layers of the memory cell arrays MCA are stacked, the bit lines BL or the word lines WL are shared between the memory cells MC adjacent to each other in the Z direction. In addition, interlayer insulating films (not illustrated) are formed around the adjacent memory cells MC and between the adjacent word lines WL and bit lines BL.

FIGS. 2A and 2B are schematic cross-sectional views illustrating a configuration of a variable resistance memory cell as a non-volatile memory device; FIG. 2A is a cross-sectional view taken along line A-A of FIG. 1; and FIG. 2B is a cross-sectional view taken along line B-B of FIG. 1. As illustrated in the figures, the memory cell MC has a structure where a rectifying layer D and a variable resistive layer VR are connected in series on a lower-layer wiring (the word line WL or the bit line BL) as a memory cell layer. In addition, an upper-layer wiring (the bit line BL or the word line WL) is disposed on the variable resistive layer VR through a capping film C.

The rectifying layer D is made of a material having a rectification function such as a Schottky barrier diode, a PN-junction diode, or a PIN diode. For example, herein, the rectifying layer D is set so as to flow a current in the direction from the bit line BL to the word line WL.

The variable resistive layer VR is configured with a variable resistive element such as a metal oxide film or a carbon film which can be switched between high and low resistance states under the control of a voltage value and an application time, a phase transition memory element of which the resistance value is changed according to a change in state between a crystallized state and an amorphous state of a chalcogenide compound, or the like. As an example of the variable resistive element, there is a metal oxide film containing at least one or more of elements such as Si, Ti, Ta, Nb, Hf, Zr, W, Al, Ni, Co, Mn, Fe, Cu, Mo, or the like. In addition, barrier metal films made of TiN, TaN, WN, or the like may be disposed above and below the variable resistive layer VR.

The capping film C is a film made of a conductive material which is introduced in terms of the process in order to connect the memory cell MC to the word line WL or bit line BL in the upper layer. Herein, a W film is used for the capping film C.

In addition, in the cross-section in the direction perpendicular to the extending direction of the upper-layer wiring, the rectifying layer D includes an area (hereinafter, referred to as a wide width portion Db) of which the width is substantially equal to that of the upper-layer wiring and an area (hereinafter, referred to as a narrow width portion Da) of which the width is smaller than that of the wide width portion Db. The narrow width portion Da is disposed at the lower-layer wiring side so that the height of the narrow width portion Da is $\frac{1}{3}$ or more of a height h of the rectifying layer D. In addition, modifying films MO described later are disposed on the two side surfaces in the extending direction of the lower-layer wiring of the wide width portion Db. In general, the modifying films MO are disposed on the two side surfaces from the wide width portion Db of the rectifying layer D to the upper-layer wiring (the word line WL or the bit line BL) in the extending direction of the lower-layer wiring. In addition, the modifying films MO are formed on the two side surfaces in the extending direction of the upper-layer wiring from the rectifying layer D to the capping film C of the memory cell MC other than the memory cell MC in the lowermost layer.

In the non-volatile memory device having such a configuration, a voltage applied to the word line WL and the bit line BL is controlled so that a predetermined voltage is applied to the intended memory cell MC. Therefore, the resistance state of the variable resistive layer VR configuring the memory cell MC is changed. More specifically, a reset (erase) process is performed to allow a current to flow into the variable resistive layer VR in a low resistance state so as to return the variable resistive layer to a high resistance state where the resistance is increased by one or two digits due to Joule's heating, or a set (write) process is performed to apply a voltage to the variable resistive layer VR in a high resistance state so as to return the variable resistive layer to a low resistance state. In this manner, the high resistance state/low resistance state is made by the reset process and the set process, so that resistance value information is stored. In addition, the difference of the current flowing in the memory cell MC is detected, so that a function as a memory is allowed to be performed. In addition, in the cross section seen from the extending direction of the upper-layer wiring, since the narrow width portion Da is disposed in a portion of the rectifying layer D, an electric field applied to the rectifying layer D is decreased. Therefore, an operation current (control current) flowing in the memory cell MC can be reduced.

FIGS. 3A to 21E are schematic cross-sectional views illustrating an example of a procedure of a method of manufacturing a non-volatile memory device according to a first embodiment. With respect to these figures, FIGS. 3A to 21A are perspective views; FIGS. 3B to 21B are cross-sectional views of the word line WL along the word line WL as views corresponding to the cross section A-A of FIG. 1; FIGS. 3C to 21C are cross-sectional views of the portion where the word line WL does not exist along the word line WL as views corresponding to the cross section C-C of FIG. 1; FIGS. 3D to 21D are cross-sectional views of the bit line BL along the bit line BL as views corresponding to the cross section B-B of FIG. 1; and FIGS. 3E to 21E are cross-sectional views of the portion where the bit line BL does not exist along the bit line BL as views corresponding to the cross section D-D of FIG. 1.

First, a peripheral circuit (not illustrated) including elements such as a cell-control transistor connected to the word lines WL and bit lines BL of the memory cell MC and wiring layers connected to the elements is formed on a semiconductor substrate (not illustrated), and an interlayer insulating film ILD1 is formed on the peripheral circuit. Next, as illustrated in FIGS. 3A to 3E, an electrode layer EL1, a rectifying layer D1, a variable resistive layer VR1, and a capping film C1 configuring the first-layer memory cell array are sequentially stacked on the entire surface covering the interlayer insulating film ILD1. In addition, for example, W can be used for the electrode layer EL1 and the capping film C1; for example, NiO can be used for the variable resistive layer VR; and for example, a polysilicon film having a PIN structure where P-type polysilicon, I-type polysilicon, and N-type polysilicon are stacked can be used for the rectifying layer D1. In addition, the same configuration can be used to form the memory cell array described hereinafter. In this example, since the current is allowed to flow from the bit line BL to the word line WL, N-type polysilicon, I-type polysilicon, and P-type polysilicon are sequentially stacked on the electrode layer EL1.

Next, a hard mask layer HM1 made of densified TEOS (D-TEOS) or the like is formed on the capping film C1. The hard mask layer HM1 is set to have such a thickness that the previously-formed layers from the electrode layer EL1 to the capping film C1 can be etched through a dry etching method such as an RIE method. In addition, resist RS1 is coated on the hard mask layer HM1, and patterning is performed through a lithography technique so as to form a line-and-space pattern extending in the X direction.

Next, as illustrated in FIGS. 4A to 4E, the hard mask layer HM1 is processed by using the resist RS1 as a mask through anisotropic etching such as an RIE method. In addition, as illustrated in FIGS. 5A to 5E, after the resist RS1 is removed through oxygen discharging, anisotropic etching such as an RIE method is performed by using the hard mask layer HM1 as a mask until the bottom of the electrode layer EL1 is cut from the adjacent electrode layer EL1. Therefore, the electrode layer EL1 becomes the word line WL1; and the rectifying layer D1, the variable resistive layer VR1, and the capping film C1 are formed in a pattern extending in the X direction, similarly to the word line WL1.

Next, as illustrated in FIGS. 6A to 6E, an interlayer insulating film ILD2 such as a TEOS film is embedded in the etched area, and the surface is planarized while the interlayer insulating film ILD2 or the hard mask layer HM1 which is formed above the capping film C1 is removed by using the capping film C1 as a stopper through a CMP method.

Next, as illustrated in FIGS. 7A to 7E, an electrode layer EL2, a rectifying layer D2, a variable resistive layer VR2, and a capping film C2 configuring a second-layer memory cell array are sequentially stacked. In addition, herein, with respect to the rectifying layer D2, P-type polysilicon, I-type polysilicon, and N-type polysilicon are sequentially stacked in the reverse order of the first-layer rectifying layer D1. This is because a current is allowed to flow from the bit line BL to the word line WL.

In addition, a hard mask layer HM2 with such a thickness that the layers from the capping film C2 to the rectifying layer D1 can be etched is formed on the capping film C2. Next, resist RS2 is coated on the hard mask layer HM2, and a pattern in which the line-and-space pattern of the lower layer is rotated 90 degrees in the in-plane direction, that is, the line-and-space pattern extending in the Y direction is formed through a lithography technique.

Next, as illustrated in FIGS. 8A to 8E, the hard mask layer HM2 is processed by using the resist RS2 as a mask through anisotropic etching such as an RIE method. In addition, as illustrated in FIGS. 9A to 9E, after the resist RS2 is removed through oxygen discharging, layers from the capping film C2 to a middle of the rectifying layer D1 is etched by using the hard mask layer HM2 as a mask through anisotropic etching such as an RIE method, so that a trench TR1 is formed. Herein, although the thickness of the rectifying layer D1 that is not etched but remains varies with an etching rate of the rectifying layer D1 and the interlayer insulating film ILD2, generally, the thickness may be set to ⅓ or more of the height (thickness) of the rectifying layer D1 from the bottom of the rectifying layer D1. If the thickness of the remaining rectifying layer D1 is less than ⅓ of the height of the rectifying layer D1, a residue may remain in a portion which is in contact with the interlayer insulating film ILD2 during the anisotropic etching preformed up to now. In this step, if the residue of the rectifying layer D1 exists, a portion of the residue of the rectifying layer D1 is also surface-modified during the surface modifying process which is to be performed later. As a result, since the residue of the rectifying layer D1 can not be removed through isotropic etching, it is preferable that the thickness of the remaining rectifying layer D1 is ⅓ or more of the height of the rectifying layer D1. In addition, in this case, the remaining interlayer insulating film ILD2 is thicker than the remaining rectifying layer D1.

Therefore, the second-layer electrode layer EL2 becomes the bit line BL1. In addition, the second-layer rectifying layer D2, the variable resistive layer VR2, and the capping film C2 are formed in a pattern extending in the Y direction, similarly to the bit line BL1 (second-layer electrode layer EL2).

Next, as illustrated in FIGS. 10A to 10E, a surface-modifying process is performed on the rectifying layer D1 in the trench TR1, a modifying film MO1 is formed on the exposed surface of the rectifying layer D1. As an example of the surface-modifying process, an oxidation process or a nitridation process can be performed. For example, in the case where oxidation is performed on the surface by using an ICP (Inductive Coupling Plasma)-RIE apparatus, a processing gas obtained by flowing $O_2$ gas at a predetermined flow rate with respect to Ar gas, He gas, or the like is introduced into a chamber of the RIE apparatus, and a radio frequency voltage is applied to only a source side to allow the processing gas to be in a plasma state, so that the rectifying layer D1 in the trench TR1 is oxidized. Therefore, the modifying film MO1 constructed with a silicon oxide film can be formed on the surface. In addition, in the case where nitridation is performed on the surface by using the ICP-RIE apparatus, a processing gas obtained by flowing $N_2$ gas at a predetermined flow rate with respect to Ar gas, He gas, or the like is introduced into the chamber of the RIE apparatus, and a radio frequency voltage is applied to only the source side to allow the processing gas to be in a plasma state, so that the rectifying layer D1 in the trench TR1 is nitridized. Therefore, the modifying film MO1 constructed with a silicon nitride film can be formed on the surface. In addition, in this case, the modifying film MO1 is also formed on the surfaces of the layers from the variable resistive layer VR1 to the capping film C2 in the area exposed due to the formation of the trench TR1 as well as on the rectifying layer D1. The modifying film MO1 is used as a mask when the lower portion of the rectifying layer D1 is etched later through isotropic etching. In addition, in FIG. 10A, the modifying film MO1 is not indicated (this is the same in the figures described hereinafter).

Next, as illustrated in FIGS. 11A to 11E, the modifying film MO1 formed on the bottom surface of the trench TR1 is removed through anisotropic etching such as an RIE method. For example, in the case where the modifying film MO1 on the bottom surface of the trench TR1 is removed by using the ICP-RIE apparatus, a processing gas obtained by flowing $CF_4$ gas at a predetermined flow rate with respect to Ar gas, He gas, or the like is introduced into the chamber of the RIE apparatus; a radio frequency voltage is applied to the source side to allow the processing gas to be in a plasma state; and a predetermined radio frequency voltage is also applied to a holder side which holds a to-be-processed object, so that the processing gas in the plasma state is accelerated toward the bottom surface of the trench TR1. Therefore, the modifying film MO1 on the bottom of the trench TR1 is removed. In addition, the process for removing the modifying film MO1 can be performed by using an apparatus such as an apparatus for forming the modifying film MO1 in FIGS. 10A to 10E.

Next, as illustrated in FIGS. 12A to 12E, the rectifying layer D1 remaining in a portion lower than the trench TR1 is etched by using the hard mask layer HM1 as a mask through anisotropic etching such as an RIE method. At this time, the etching is performed until the surface of the lower-layer word line WL1 is exposed.

Figure 22:
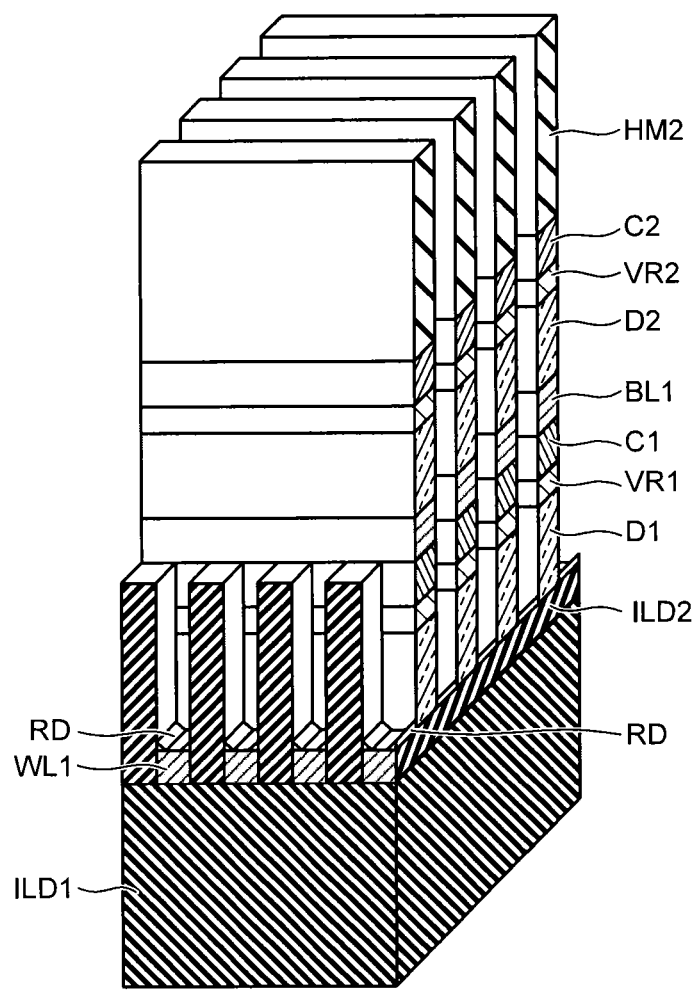
FIG. 22 is a schematic view illustrating a state of residues occurring during an anisotropic etching.

However, when the rectifying layer D1 is etched in the thickness direction, there is a possibility that a residue occurs near the lower portion of the interlayer insulating film ILD2 adjacent to the rectifying layer D1. FIG. 22 is a schematic view illustrating a state of residues occurring during an anisotropic etching. In the case where the etching rate of the rectifying layer D1 is larger than that of the interlayer insulating film ILD2, the surface of the interlayer insulating film ILD2 becomes higher than the surface of the rectifying layer D1 due to the etching. In addition, generally, the cross section of the pattern formed in FIGS. 5A to 5E has a forward tapered shape, and the cross section of the interlayer insulating film ILD2 embedded between the patterns in FIGS. 6A to 6E has a inverse tapered shape. Therefore, when a portion near the boundary of the rectifying layer D1 with respect to the word line WL1 is etched, the interlayer insulating film ILD2 becomes an eave-shaped portion, so that the rectifying layer D1 is difficult to be etched, and thus, a residue RD may remain. The residue RD causes short-circuit between the adjacent memory cells MC.

Therefore, a process for removing the residue RD is, subsequently performed. In other words, as illustrated in FIGS. 13A to 13E, the residue RD remaining near the lower portion of the interlayer insulating film ILD2 adjacent to the rectifying layer D1 is removed through isotropic etching. For example, in the case where the residue RD remaining in the lower portion of the interlayer insulating film ILD2 adjacent to the rectifying layer D1 is removed through isotropic etching by using an ICP-RIE apparatus, a processing gas containing HBr gas or $Cl_2$ gas is introduced into a chamber of the RIE apparatus, and a radio frequency voltage is applied to a source side to allow the processing gas to be in a plasma state. Next, isotropic etching is performed in the trench TR1 by using the processing gas in the plasma state. At this time, since the modifying film MO1 is formed on the surface from a portion of the rectifying layer D1 to the capping film C2, the surface is not etched; but the residue RD remaining in the lower portion of the rectifying layer D1 where the modifying film MO1 is not formed and the residue RD remaining in the lower portion of the interlayer insulating film ILD2 adjacent to the rectifying layer D1 are etched. The etching process time is considered to be a period of time for removing the residue RD. As a result, the lower portion of the rectifying layer D1 becomes a narrow width portion D1$a$ of which the width in the extending direction of the lower-layer wiring is smaller than that of the area where the modifying film MO1 is formed, and the area where the modifying film MO1 of the rectifying layer D1 is formed becomes a wide width portion D1$b$ of which the width is substantially equal to that of the upper-layer wiring (bit line BL1). The isotropic etching process during the removing of the residue RD can be performed by using an apparatus such as an apparatus for forming the modifying film MO1 in FIGS. 10A to 10E and an apparatus for removing the modifying film MO1 on the bottom of the trench TR1 in FIGS. 11A to 11E.

In addition, as illustrated in FIGS. 13A to 13E, in the removing of the residue RD, the entire interlayer insulating film ILD2 in the trench TR1 needs not to be removed, but the etching process necessary for forming the lower-layer memory cell MC may be completed in such a state where the interlayer insulating film ILD2 has some degree of height. As a result, in comparison with the case where the etching is performed so that the interlayer insulating film ILD2 is sufficiently fallen down, the thickness of the hard mask layer HM2 can be suppressed.

Therefore, the memory cell MC configured with a stacked film of the capping film C1 and the variable resistive layer VR1 which are defined by the width of the word line WL1 and the width of the bit line BL1 and the rectifying layer D1 of which a portion of the cross section in the direction perpendicular to the extending direction of the bit line BL1 is narrower than the bit line BL1, is arranged at each intersection position of the word line WL1 and the bit line BL1, so that the first-layer memory cell array is formed.

Next, as illustrated in FIGS. 14A to 14E, an interlayer insulating film ILD3 such as a TEOS film is embedded in the etched area, and the surface is planarized while the interlayer insulating film ILD3 or the hard mask layer HM2 which is formed above the capping film C2 is removed by using the capping film C2 as a stopper through a CMP method.

Next, the processes illustrated in FIGS. 7A to 14E are repetitively performed until a desired number of layers of the memory cell arrays are stacked. However, the line-and-space patterns are configured so that the extending directions of the line-and-space patterns formed on the electrode layers become the X direction, the Y direction, the X direction, . . . .

Next, as illustrated in FIGS. 15A to 15E, an electrode layer EL3 which is to be the uppermost-layer wiring is formed. Herein, subsequently to FIGS. 14A to 14E, the electrode layer EL3 is formed so as to be in contact with the capping film C2. In addition, a hard mask layer HM3 with such a thickness that can etch from the electrode layer EL3 to the second-layer rectifying layer D2 is formed on the electrode layer EL3. Next, resist RS3 is coated on the hard mask layer HM3, and a pattern in which the line-and-space pattern of the lower layer is rotated 90 degrees in-plane direction, that is, the line-and-space pattern extending in the X direction is formed through a lithography technique.

Next, as illustrated in FIGS. 16A to 16E, the hard mask layer HM3 is processed by using the resist RS3 as a mask through anisotropic etching such as an RIE method. In addition, etching is performed from the electrode layer EL3 to a middle of the rectifying layer D2 by using the hard mask layer HM3 as a mask through anisotropic etching such as an RIE method, so that a trench TR2 is formed. Herein, the thickness of the rectifying layer D2 that is not etched but remains may be set to ⅓ or more of the height (thickness) of the rectifying layer D2. In addition, in this case, the remaining interlayer insulating film ILD3 is thicker than the rectifying layer D2. Accordingly, the third-layer electrode layer EL3 becomes the word line WL2.

Next, as illustrated in FIGS. 17A to 17E, a surface-modifying process is performed on the rectifying layer D2 in the trench TR2, so that a modifying film MO2 is formed on the exposed surface of the rectifying layer D2. Similarly to the case of FIGS. 10A to 10E, as an example of the surface-modifying process, an oxidation process or a nitridation process can be performed. In addition, the modifying film MO2 is also formed on the surfaces of the layers from the variable resistive layer VR2 to the word line WL2 in the area exposed due to the formation of the trench TR2 as well as on the rectifying layer D2. The modifying film MO2 is used as a mask when the lower portion of the rectifying layer D2 is etched through isotropic etching later on.

Next, as illustrated in FIGS. 18A to 18E, the modifying film MO2 formed on the bottom surface of the trench TR2 is removed through anisotropic etching such as an RIE method. Next, as illustrated in FIGS. 19A to 19E, the remaining rectifying layer D2 is etched by using the hard mask layer HM3 as a mask through anisotropic etching such as an RIE method. At this time, the etching is performed until the surface of the lower-layer bit line BL1 is exposed. However, in this case, similarly to the case of FIGS. 12A to 12E and FIG. 22, when the rectifying layer D2 is etched in the thickness direction, since there is a possibility that a residue RD occurs near the lower portion of the interlayer insulating film ILD3 adjacent to the rectifying layer D2, a process for removing the residue RD is subsequently performed.

Next, as illustrated in FIGS. 20A to 20E, the residue RD remaining near the lower portion of the interlayer insulating film ILD3 adjacent to the rectifying layer D2 is removed through isotropic etching. Herein, similarly to the case of FIGS. 13A to 13E, in the case where the residue RD remaining in the lower portion of the interlayer insulating film ILD3 adjacent to the rectifying layer D2 is removed through isotropic etching by using an ICP-RIE apparatus, a processing gas containing HBr gas or $Cl_2$ gas is introduced into a chamber of the RIE apparatus, and a radio frequency voltage is applied to a source side to allow the processing gas to be in a plasma state, so that the etching can be performed. Therefore, the area where the modifying film MO2 is formed on the surface from the rectifying layer D2 to the word line WL2 is not etched, but the residue RD remaining in the lower portion of the rectifying layer D2 where the modifying film MO2 is not formed and the residue RD remaining in the lower portion of the interlayer insulating film ILD3 adjacent to the rectifying layer D2 are etched. As a result, the lower portion of the rectifying layer D2 becomes a narrow width portion D2a of which the width in the extending direction (Y direction) of the lower-layer wiring is smaller than that of the area where the modifying film MO2 is formed; and the area where the modifying film MO2 of the rectifying layer D2 is formed becomes a wide width portion D2b.

Therefore, the memory cell MC configured with a stacked film of the capping film C2 and the variable resistive layer VR2 which are defined by the width of the word line WL2 and the width of the bit line BL1 and the rectifying layer D2 of which a portion of the cross section in the direction perpendicular to the extending direction of the word line WL2 is narrower than the word line WL2, is arranged at each intersection position of the word line WL2 and the bit line BL1, so that the second-layer memory cell array is formed.

In addition, as illustrated in FIGS. 20A to 20E, in the removing of the residue RD, the entire interlayer insulating film ILD3 in the trench TR2 needs not to be removed, but the etching process necessary for forming the lower-layer memory cell MC may be completed in such a state where the interlayer insulating film ILD3 has some degree of height. As a result, in comparison with the case where the etching is performed so that the interlayer insulating film ILD3 is sufficiently fallen down, the thickness of the hard mask layer HM3 can be suppressed.

In addition, as illustrated in FIGS. 21A to 21E, an interlayer insulating film ILD4 such as a TEOS film is embedded in the etched area, and the surface is planarized while the interlayer insulating film ILD4 or the hard mask layer HM3 which is formed above the word line WL2 is removed by using the word line WL2 as a stopper through a CMP method. Accordingly, a non-volatile memory device is manufactured.

In addition, an apparatus such as an RIE apparatus for etching layers configuring a memory cell array and etching hard masks disposed above the layers can be used for an apparatus for forming the modifying film MO1 in FIGS. 10A to 10E, an apparatus for removing the modifying film MO1 on the bottom of the trench TR1 in FIGS. 11A to 11E, an apparatus for performing isotropic etching during the removing of the residue RD in FIGS. 13A to 13E, an apparatus for forming the modifying film MO2 in FIGS. 17A to 17E, an apparatus for removing the modifying film MO2 on the bottom of the trench TR2 in FIGS. 18A to 18E, and an apparatus for performing isotropic etching during the removing of the residue RD in FIGS. 20A to 20E.

As described hereinbefore, in the embodiment, the layer having the electrode layer EL2, the rectifying layer D2, and the variable resistive layer VR2 which are to be the second-layer memory cell MC is stacked on the layer having the rectifying layer D1 and the variable resistive layer VR1 which are to be the first-layer memory cell MC processed in a line-and-space shape so as to extend in the first direction, and after that, the trench TR1 is formed in a line-and-space shape extending in the second direction perpendicular to the first direction from the variable resistive layer VR2 to a middle of the rectifying layer D1 so that ⅓ or more of the height of the rectifying layer D1 remains. Next, the modifying film MO1 is formed on the side wall of the trench TR1; the remaining rectifying layer D1 is etched; and after that, isotropic etching is performed. Therefore, the residue RD remaining in the lower portion of the interlayer insulating film ILD2 adjacent to the rectifying layer D1 can be removed while the interlayer insulating film ILD2 is not fallen down, for example, down to the surface of the lower-layer wiring of the first-layer memory cell MC. As a result, it is possible to obtain an effect in that the film thickness of a mask film necessary for the processing can be reduced. In addition, like an extracting portion, even in the area where the lower layer is only the interlayer insulating film, useless falling of the interlayer insulating film is unnecessary, so that it is possible to obtain an effect in that pattern collapse easily occurring in this area can be suppressed.

In addition, the narrow width portion Da is formed in the lower portion of the rectifying layer D of the memory cell MC formed in this manner. Herein, in the memory cell MC having a structure where the rectifying layer D and the variable resistive layer VR are sequentially stacked between the lower-layer and upper-layer wirings, the electric field is particularly concentrated on the area near the wirings in the rectifying layer D, and the width of the rectifying layer D in this area becomes locally small, so that the electric field applied to the rectifying layer D is effectively alleviated. As a result, it is possible to obtain an effect in that the operation current can be decreased. In addition, in the embodiment, although the structure where the modifying film MO is formed at two side surfaces from the wide width portion Db in the upper portion of the rectifying layer D in the memory cell MC to the capping film C is described, the modifying film MO may be removed during a cleansing process which is generally performed after the memory cell MC is etched in a columnar shape.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile memory device comprising:
    a first wiring extending in a first direction;
    a second wiring extending in a second direction perpendicular to the first direction; and
    a non-volatile memory cell which is disposed at an intersection position of the first wiring and the second wiring so as to be interposed between the first and second wirings and is configured so that a rectifying layer and a variable resistive layer are sequentially stacked above the first wiring, wherein
    the rectifying layer includes a first area having a width which is substantially equal to a width of the second wiring, and a second area which is formed on the first wiring side to have a width smaller than the width of the first area and to have a thickness which is ⅓ or more of a height of the rectifying layer, at a cross section perpendicular to the second direction.

2. The non-volatile memory device according to claim 1, further comprising a modifying film on two side surfaces in the first direction from the first area of the rectifying layer to the second wiring.

3. The non-volatile memory device according to claim 2, wherein the modifying film is disposed on two side surfaces in the second direction from the rectifying layer to the variable resistive layer.

4. The non-volatile memory device according to claim 2, wherein the modifying film is an oxide film or a nitride film.

5. The non-volatile memory device according to claim 1, wherein the variable resistive layer is a metal oxide film containing at least one or more element selected from a group consisting of Si, Ti, Ta, Nb, Hf, Zr, W, Al, Ni, Co, Mn, Fe, Cu, and Mo, a carbon film, or a chalcogenide compound film.

* * * * *